United States Patent
Komatsu

[11] Patent Number: 5,999,018
[45] Date of Patent: Dec. 7, 1999

[54] PROGRAMMABLE BUFFER CIRCUIT COMPRISING REDUCED NUMBER OF TRANSISTORS

[75] Inventor: Noriaki Komatsu, Tokyo, Japan

[73] Assignee: NEC Corporation, Tokyo, Japan

[21] Appl. No.: 08/986,728

[22] Filed: Dec. 8, 1997

[30] Foreign Application Priority Data

Dec. 9, 1996 [JP] Japan ................................. 8-328445

[51] Int. Cl.$^6$ ............................................. H03K 19/0185
[52] U.S. Cl. .......................... 326/83; 326/120; 326/121; 326/50
[58] Field of Search ................................. 326/35, 36, 49, 326/50, 82, 83, 121, 112, 117, 119–120, 122

[56] References Cited

U.S. PATENT DOCUMENTS

| | | | |
|---|---|---|---|
| 3,986,043 | 10/1976 | Buckley, III et al. | 326/50 |
| 4,481,432 | 11/1984 | Davies, Jr. | 326/49 |
| 4,482,822 | 11/1984 | Kamuro et al. | 326/49 |
| 4,612,459 | 9/1986 | Pollachek . | |
| 4,634,893 | 1/1987 | Craycraft et al. | 326/49 |

FOREIGN PATENT DOCUMENTS 54-61492  5/1979  Japan .

*Primary Examiner*—Michael Tokar
*Assistant Examiner*—Don Phu Le
*Attorney, Agent, or Firm*—Young & Thompson

[57] ABSTRACT

A programmable buffer circuit includes a first stage circuit which receives an input signal IN indicative of a first or second value, and a second stage circuit, responsive to an output of the first stage circuit, for outputting one of a value designated depending on the value of the input signal and a value designated regardless of the value of the input signal. The second stage circuit includes a plurality of MOS transistors whose conduction properties change depending on whether ion implantation is applied thereto. By applying the ion implantation selectively to the MOS transistors, the second stage circuit is operated as a transfer logical function circuit or an inverter logical function circuit.

14 Claims, 4 Drawing Sheets

|  | ENHANCEMENT TYPE | DEPLETION TYPE |
|---|---|---|
| P-CHANNEL | − 0.8 (V) | + 3.0 (V) |
| N-CHANNEL | + 0.7 (V) | − 3.0 (V) |

PROGRAMMABLE BUFFER CIRCUIT COMPRISING REDUCED NUMBER OF TRANSISTORS

BACKGROUND OF THE INVENTION

The present invention relates to a buffer circuit and, in particular, to a buffer circuit which allows selection of operating states, that is, selection or non-selection, using an input signal, relative to a plurality of semiconductor devices, such as a semiconductor storage, according to a user's purpose.

Such a buffer circuit is used, for example, for making it possible to desirably select operating states of a plurality of semiconductor devices, such as a mask ROM, using an input signal according to a user's request. For example, a user may request that a semiconductor device be set to an operating state, that is, a selected state, when a low-level input signal is supplied. On the other hand, another user may request that a semiconductor device be set to an operating state when a high-level input signal is supplied. Further, another user may request that a semiconductor device be set to an operating state regardless of whether an input signal is at a low or high level.

For satisfying such requests, the buffer circuit is arranged so as to be capable of selecting one of three modes which correspond to the foregoing user's three kinds of requests, that is, the buffer circuit is arranged to be programmable. The buffer circuit of this type is disclosed, for example, in U. S. Pat. No. 4,612,459.

As will be described later in detail, this buffer circuit comprises a first stage circuit including an NOR circuit and a plurality of MOS transistors and a second stage circuit including an exclusive-OR circuit and a plurality of MOS transistors. Each of the foregoing MOS transistors changes from the enhancement type to the depletion type by ion implantation to change its conduction property. Specifically, the foregoing MOS transistors act as switching elements and are used for selecting one of the following three modes:

(1) In the first mode, a low-level output signal is produced as a selection signal when an input signal has a low level. This mode is called a low active mode.

(2) In the second mode, a low-level output signal is produced as a selection signal when an input signal has a high level. This mode is called a high active mode.

(3) In the third mode, a low-level output signal is produced as a selection signal irrespective of whether an input signal has a low or a high level. This mode is called a don't care active mode.

A user can designate one of the foregoing first to third modes. According to this designation, the ion implantation is selectively carried out relative to the foregoing plurality of MOS transistors during fabrication of the buffer circuit. For this reason, the foregoing buffer circuit is called a programmable buffer circuit.

However, the foregoing buffer circuit, particularly the second stage circuit thereof, requires the MOS transistors in large number since the exclusive-OR circuit is used. This results in a large chip area.

SUMMARY OF THE INVENTION

Therefore, it is an object of the present invention to provide a programmable buffer circuit with a reduced number of transistors.

According to one aspect of the present invention, there is provided a programmable buffer circuit comprising a first stage circuit including an NOR logical function circuit which receives an input signal indicative of a first or second value; and a second stage circuit, responsive to an output of the NOR logical function circuit, for outputting one of a value designated depending on the value of the input signal and a value designated regardless of the value of the input signal. The second stage circuit includes a plurality of MOS transistors whose conduction properties change depending on whether ion implantation is applied thereto. By applying the ion implantation selectively to the MOS transistors, the second stage circuit is operated as a transfer logical function circuit or an inverter logical function circuit.

According to another aspect of the present invention, there is provided a programmable buffer circuit comprising a first stage circuit including an inverter logical function circuit which receives an input signal indicative of a first or second value; and a second stage circuit, responsive to an output of the first stage circuit, for outputting a value designated depending on the value of the input signal. The second stage circuit includes a plurality of MOS transistors whose conduction properties change depending on whether ion implantation is applied thereto. By applying the ion implantation selectively to the MOS transistors, the second stage circuit is operated as a transfer logical function circuit or an inverter logical function circuit.

DESCRIPTION OF THE PREFERRED EMBODIMENT

In order to facilitate understanding of the present invention, the foregoing conventional buffer circuit will be first explained hereinbelow before describing preferred embodiments of the present invention.

Figure 1:
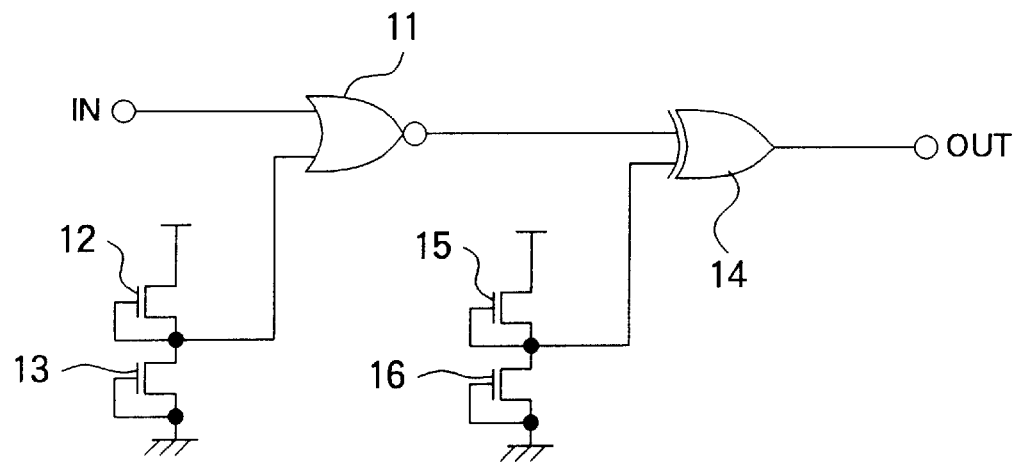
FIG. 1 is a diagram showing a conventional buffer circuit.

In FIG. 1, the buffer circuit comprises a first stage circuit including an NOR circuit 11 and MOS transistors 12 and 13, and a second stage circuit including an exclusive-OR circuit 14 and MOS transistors 15 and 16. Each of the MOS transistors 12, 13, 15 and 16 changes from the enhancement type to the depletion type by the ion implantation to change its conduction property. The foregoing MOS transistors 12, 13, 15 and 16 act as switching elements and are used for selecting one of the following three modes:

(1) In the first mode, the ion implantation is applied to the MOS transistors 13 and 15. In this case, a low-level output signal OUT is produced as a selection signal when an input signal IN has a low level. This mode is called a low active mode.

(2) In the second mode, the ion implantation is applied to the MOS transistors 13 and 16. In this case, the low-level output signal OUT is produced as the selection signal when the input signal IN has a high level. This mode is called a high active mode.

(3) In the third mode, the ion implantation is applied to the MOS transistors 12 and 16. In this case, the low-level output signal OUT is produced as the selection signal irrespective of whether the input signal IN has the low or high level. This mode is called a don't care active mode.

A user can designate one of the foregoing first to third modes. According to this designation, the ion implantation is selectively carried out relative to the MOS transistors 12, 13, 15 and 16 during fabrication of the buffer circuit. For this reason, the foregoing buffer circuit is called a programmable buffer circuit.

Now, the number of the transistors required for constituting the foregoing buffer circuit is considered. In the first stage circuit, in addition to the MOS transistors 12 and 13, four transistors are necessary for constituting the NOR circuit 11. As a result, the first stage circuit requires six transistors. In the second stage circuit, in addition to the MOS transistors 15 and 16, six transistors are necessary for constituting the exclusive-OR circuit 14. As a result, the second stage circuit requires eight transistors.

Figure 2:
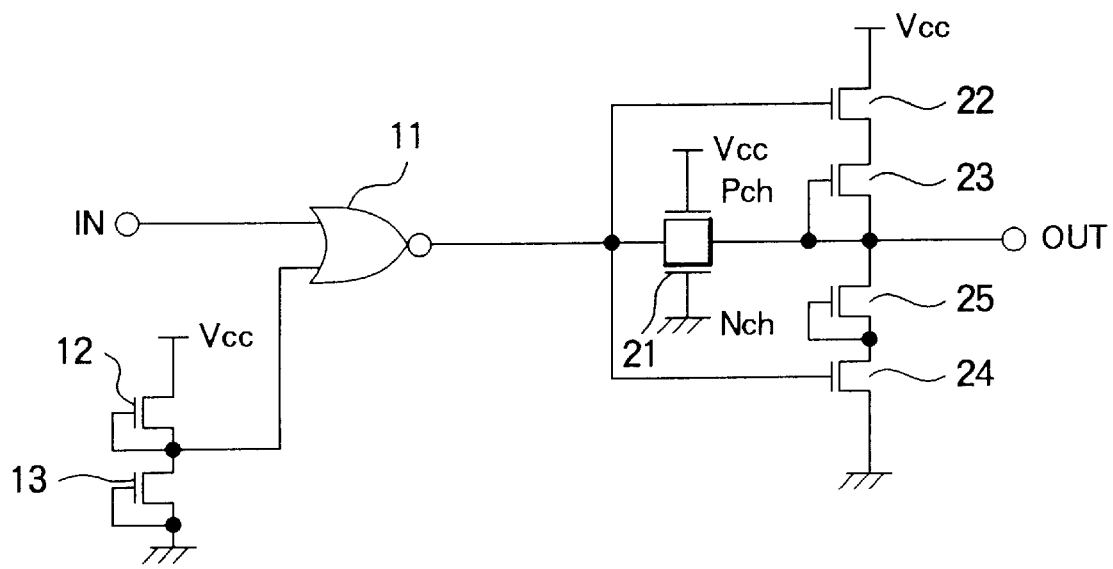
FIG. 2 is a diagram showing a buffer circuit according to a first preferred embodiment of the present invention.

Referring to FIG. 2, a buffer circuit according to the first preferred embodiment of the present invention will be described. In this embodiment, a first stage circuit of the buffer circuit is the same as the first stage circuit shown in FIG. 1. Specifically, the first stage circuit comprises an NOR circuit 11 and MOS transistors 12 and 13 whose conduction properties change by the ion implantation. A second stage circuit of the buffer circuit comprises a first circuit including a p- and n-channel common MOS transistor 21 whose conduction property changes by the ion implantation, a second circuit including a p-channel MOS transistor 22 and a MOS transistor 23 whose conduction property changes by the ion implantation, and a third circuit including an n-channel MOS transistor 24 and an MOS transistor 25 whose conduction property changes by the ion implantation.

The first circuit is a p- and n-channel common circuit, and the MOS transistor 21 is connected between an output terminal of the NOR circuit 11 and an output terminal of the output signal OUT. The second circuit is a p-channel circuit, and a series circuit of the MOS transistors 22 and 23 is connected between a power supply terminal Vcc and the output terminal of the output signal OUT. More specifically, the gate of the MOS transistor 22 is connected to the output side of the NOR circuit 11, while the drain thereof is connected to the power supply terminal Vcc. The drain of the MOS transistor 23 is connected to the source of the MOS transistor 22, while the gate and the source of the MOS transistor 23 are connected to the output terminal side of the output signal OUT. The third circuit is an n-channel circuit, and a series circuit of the MOS transistors 24 and 25 is connected between the ground terminal and the output terminal of the output signal OUT. Specifically, the gate of the MOS transistor 24 is connected to the output side of the NOR circuit 11, while the source thereof is connected to the ground terminal. On the other hand, the gate and the source of the MOS transistor 25 are connected to the drain of the MOS transistor 24, while the drain of the MOS transistor 25 is connected to the output terminal side of the output signal OUT.

The buffer circuit thus arranged is programmable with the following three kinds of modes:

(1) By applying the ion implantation to the MOS transistors 13, 23 and 25, a low-level output signal OUT is produced as a selection signal when an input signal IN has a low level. This means that the buffer circuit is programmed into the low active mode.

(2) By applying the ion implantation to the MOS transistors 13 and 21, the low-level output signal OUT is produced as the selection signal when the input signal IN has a high level. This means that the buffer circuit is programmed into the high active mode.

(3) By applying the ion implantation to the MOS transistors 12 and 21, the low-level output signal OUT is produced as the selection signal irrespective of whether the input signal IN has the low or high level. This means that the buffer circuit is programmed into the don't care active mode.

As appreciated from FIG. 2 and the foregoing description, in this embodiment, by applying the ion implantation selectively to the MOS transistors 12, 13, 21, 23 and 25, the second stage circuit can be operated as an inverter circuit or a transfer circuit. Particularly, since the second stage circuit uses no exclusive-OR circuit as shown in FIG. 1, it can be realized by five transistors. Even if the MOS transistor 21 is counted as two transistors, the second stage circuit can be realized by six transistors.

Figure 3:
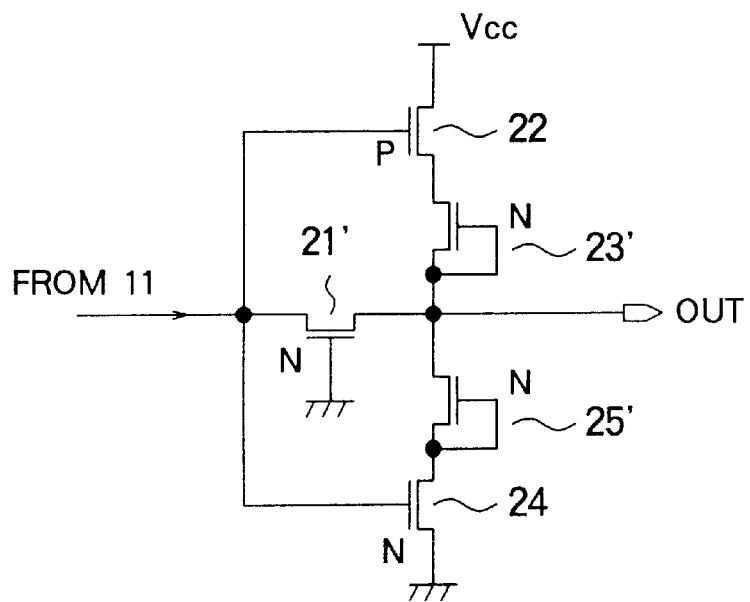
FIG. 3 is a diagram showing a modification of a second stage circuit of the buffer circuit shown in FIG. 2.

FIG. 3 shows a modification of the second stage circuit shown in FIG. 2. In this modification, the p- and n-channel common MOS transistor 21 shown in FIG. 2 is replaced with an n-channel MOS transistor 21' whose conduction property changes by the ion implantation. Further, n-channel MOS transistors 23' and 25' are used in the second and third circuits as MOS transistors to be subjected to the ion implantation.

Figure 4:
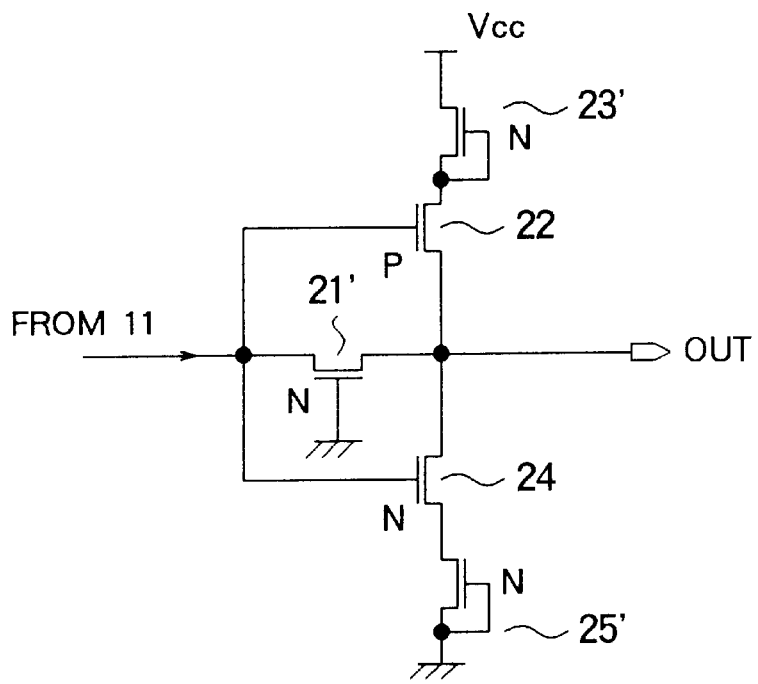
FIG. 4 is a diagram showing a modification of the second stage circuit of the buffer circuit shown in FIG. 3.

FIG. 4 shows a modification of the second stage circuit shown in FIG. 3. In this modification, positions of the MOS transistors 22 and 23' shown in FIG. 3 are replaced with each other, and positions of the MOS transistors 24 and 25' shown in FIG. 3 are replaced with each other.

Figure 5:
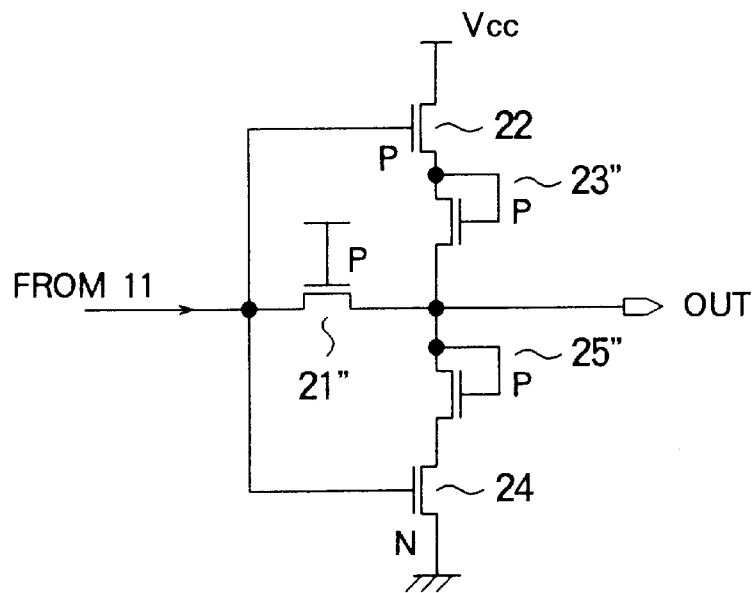
FIG. 5 is a diagram showing another modification of the second stage circuit of the buffer circuit shown in FIG. 2.

FIG. 5 shows another modification of the second stage circuit shown in FIG. 2. In this modification, the MOS transistor 21 shown in FIG. 2 is replaced with a p-channel MOS transistor 21" whose conduction property changes by the ion implantation. Further, p-channel MOS transistors 23" and 25" are used in the second and third circuits as MOS transistors to be subjected to the ion implantation.

Figure 6:
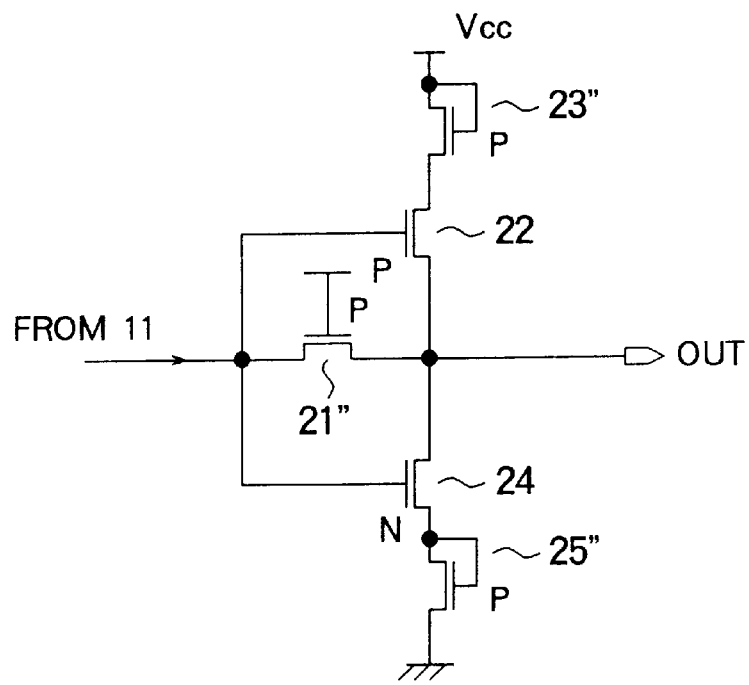
FIG. 6 is a diagram showing a modification of the second stage circuit of the buffer circuit shown in FIG. 5.

FIG. 6 shows a modification of the second stage circuit shown in FIG. 5. In this modification, positions of the MOS transistors 22 and 23" shown in FIG. 5 are replaced with each other, and positions of the MOS transistors 24 and 25" shown in FIG. 5 are replaced with each other.

Figures 7, 8:
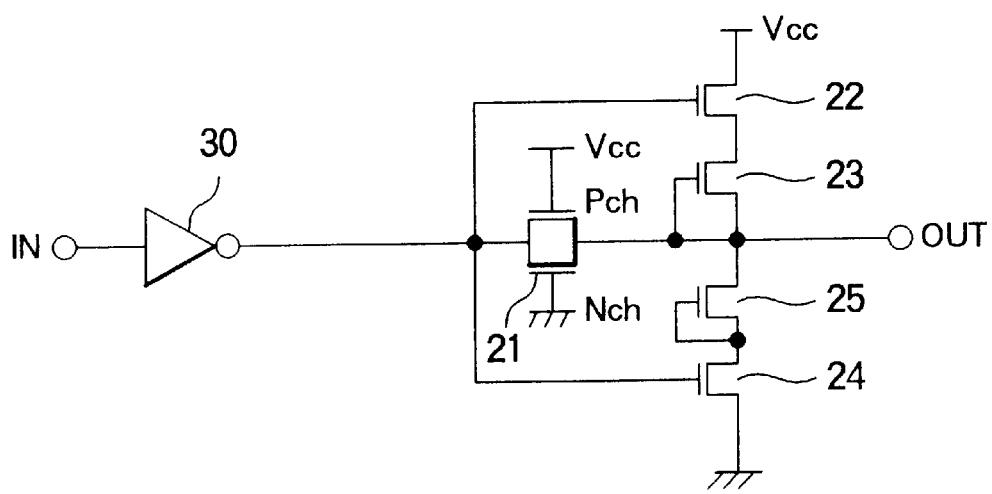
FIG. 7 is a diagram showing voltages applied to a plurality of MOS transistors in the buffer circuits shown in FIGS. 2 to 6.
FIG. 8 is a diagram showing a buffer circuit according to a second preferred embodiment of the present invention.

In each of the buffer circuits shown in FIGS. 2 to 6, voltages Vt applied to the respective MOS transistors upon the enhancement or depletion type become as shown in FIG. 7.

Now, referring to FIG. 8, a buffer circuit according to the second preferred embodiment of the present invention will be described. In this embodiment, the buffer circuit is programmable with the low active mode and the high active mode. This buffer circuit differs from the buffer circuit of the first preferred embodiment in that a first stage circuit in this embodiment is constituted only by an inverter 30. The buffer circuit thus arranged is programmable with the following two kinds of modes:

(1) By applying the ion implantation to the MOS transistors 23 and 25, a low-level output signal OUT is produced as a selection signal when an input signal IN has a low level.

This means that the buffer circuit is programmed into the low active mode.

(2) By applying the ion implantation to the MOS transistor 21, the low-level output signal OUT is produced as the selection signal when the input signal IN has a high level. This means that the buffer circuit is programmed into the high active mode.

As appreciated, a second stage circuit of the buffer circuit shown in FIG. 8 may be arranged as shown in FIGS. 3 to 6, respectively.

The NOR circuit, the inverter circuit and the transfer circuit are not limited to those shown in the figures, but may be realized by various logical function circuits.

In the buffer circuit according to the present invention, the second stage circuit uses no exclusive-OR circuit, but comprises the plurality of MOS transistors which can be converted from the enhancement type to the depletion type by the ion implantation. By applying the ion implantation selectively to the plurality of MOS transistors, the second stage circuit is operated as an inverter logical function circuit or a transfer logical function circuit. This can reduce the number of the transistors required for constituting the second stage circuit at least by two as compared with the conventional buffer circuit. Thus, the design of the buffer circuit can be facilitated and the chip area can be reduced. Further, the speed-up of signal transmission can be expected corresponding to the reduction in number of the transistors.

What is claimed is:

1. A programmable buffer circuit comprising:
   a first stage circuit including an NOR logical function circuit which receives an input signal indicative of a first or second value; and
   a second stage circuit, responsive to an output of said NOR logical function circuit, for outputting one of a value designated depending on the value of said input signal and a value designated regardless of the value of said input signal,
   said second stage circuit including,
      a first circuit including a first MOS transistor whose conduction property changes by ion implantation, said first MOS transistor being connected between an output of said NOR logical function circuit and an output terminal of said second stage circuit,
      a second circuit including a series circuit of a p- or n-channel MOS transistor whose gate is connected to the output of said NOR logical function circuit and a second MOS transistor whose conduction property changes by ion implantation, said second circuit being connected between a power supply terminal and the output terminal of said second stage circuit, and
      a third circuit including a series circuit of an n- or p-channel MOS transistor whose gate is connected to the output of said NOR logical function circuit and a third MOS transistor whose conduction property changes by ion implantation, said third circuit being connected between a ground terminal and the output terminal of said second stage circuit
   wherein, by applying the ion implantation selectively to said MOS transistors, said second stage circuit is one of a transfer logical function circuit and an inverter logical function circuit.

2. A programmable buffer circuit as claimed in claim 1, wherein said first stage circuit comprises said NOR logical function circuit receiving said input signal as one of inputs thereof, and two MOS transistors whose conduction properties change depending on whether ion implantation is applied thereto, said two MOS transistors being connected in series between the power supply terminal and the ground terminal and further connected to the other input of said NOR logical function circuit.

3. A programmable buffer circuit as claimed in claim 1, wherein said first MOS transistor is a p- and n-channel common MOS transistor.

4. A programmable buffer circuit as claimed in claim 1, wherein said first MOS transistor is one of a p-channel MOS transistor and an n-channel MOS transistor.

5. A programmable buffer circuit comprising:
   a first stage circuit including an inverter logical function circuit which receives an input signal indicative of a first or second value; and
   a second stage circuit, responsive to an output of said first stage circuit, for outputting a value designated depending on the value of said input signal,
   said second stage circuit including,
      a first circuit including a first MOS transistor whose conduction property changes by ion implantation, said first MOS transistor being connected between an output of said first stage circuit and an output terminal of said second stage circuit,
      a second circuit including a series circuit of a p- or n-channel MOS transistor whose gate is connected to the output of said first stage circuit and a second MOS transistor whose conduction property changes by ion implantation, said second circuit being connected between a power supply terminal and the output terminal of said second stage circuit, and
      a third circuit including a series circuit of an n- or p-channel MOS transistor whose gate is connected to the output of said first stage circuit and a third MOS transistor whose conduction property changes by ion implantation, said third circuit connected between a ground terminal and the output terminal of said second stage circuit
   wherein, by applying the ion implantation selectively to said MOS transistors, said second stage circuit is one of a transfer logical function circuit and an inverter logical function circuit.

6. A programmable buffer circuit as claimed in claim 5, wherein said first MOS transistor is one of a p-channel MOS transistor and an n-channel MOS transistor.

7. A programmable buffer circuit as claimed in claim 5, wherein said first MOS transistor is a p- and n-channel common MOS transistor.

8. A buffer circuit, comprising:
   a logic circuit receiving an input having a first value and a second value;
   an output terminal providing a buffer circuit output signal;
   a first MOS transistor whose conduction property changes upon ion implantation and that is connected between an output from said logic circuit and said output terminal;
   a second MOS transistor connected to a third MOS transistor in series between a power supply and said output terminal, one of said second and third MOS transistors having its gate connected to the output from said logic circuit and the other of said second and third MOS transistors having a conduction property that changes upon ion implantation; and
   a fourth MOS transistor connected to a fifth MOS transistor in series between said output terminal and a ground, one of said fourth and fifth MOS transistors having its gate connected to the output from said logic circuit and the other of said fourth and fifth MOS transistors having a conduction property that changes upon ion implantation.

9. The circuit of claim 8, wherein said logic circuit comprises an inverter circuit that inverts the input, and the buffer circuit output signal has a value that is dependent on the value of the input.

10. The circuit of claim 8, wherein said logic circuit comprises a NOR circuit with a first terminal receiving the input and a second terminal receiving a signal from between two MOS transistors connected in series between the power supply and the ground, both of said two transistors having conduction properties that change upon ion implantation, and the buffer circuit output signal has a value that is one of dependent on the value of the input and not dependent on the value of the input.

11. The circuit of claim 8, wherein said other of said second and third transistors has its gate connected to said output terminal.

12. The circuit of claim 8, wherein said other of said second and third transistors has its gate connected to the series connection between said second and third transistors.

13. The circuit of claim 8, wherein said other of said fourth and fifth transistors has its gate connected to said output terminal.

14. The circuit of claim 8, wherein said other of said fourth and fifth transistors has its gate connected to the series connection between said fourth and fifth transistors.

* * * * *